United States Patent
Uchida et al.

(10) Patent No.: US 10,340,093 B2
(45) Date of Patent: Jul. 2, 2019

(54) SOLAR CELL SYSTEM AND METHOD FOR OPERATING SOLAR CELL SYSTEM

(71) Applicant: Panasonic Intellectual Property Management Co., Ltd., Osaka (JP)

(72) Inventors: Ryuusuke Uchida, Osaka (JP); Michio Suzuka, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/941,827

(22) Filed: Mar. 30, 2018

(65) Prior Publication Data

US 2018/0226200 A1 Aug. 9, 2018

Related U.S. Application Data

(63) Continuation of application No. PCT/JP2017/015810, filed on Apr. 20, 2017.

(30) Foreign Application Priority Data

Jun. 21, 2016 (JP) ................................. 2016-122718

(51) Int. Cl.
*H01G 9/20* (2006.01)
*H02S 40/30* (2014.01)
(Continued)

(52) U.S. Cl.
CPC ....... *H01G 9/2009* (2013.01); *H01L 51/0031* (2013.01); *H01L 51/4226* (2013.01);
(Continued)

(58) Field of Classification Search
CPC ... H01G 9/2009; H02S 40/30; H01L 51/0031; H01L 51/4226; H01L 51/44
See application file for complete search history.

(56) References Cited

U.S. PATENT DOCUMENTS

2012/0017976 A1* 1/2012 Nechache ............. H01L 31/032
 136/255
2015/0287848 A1 10/2015 Jun
2017/0301479 A1* 10/2017 Moehl .................. H01L 51/447

FOREIGN PATENT DOCUMENTS

JP 11-186581 7/1999
JP 2009-146585 7/2009
(Continued)

OTHER PUBLICATIONS

International Search Report of PCT application No. PCT/JP2017/015810 dated Jun. 6, 2017.
(Continued)

*Primary Examiner* — Jayne L Mershon
(74) *Attorney, Agent, or Firm* — Renner, Otto, Boisselle & Sklar, LLP

(57) ABSTRACT

A solar cell system includes a solar cell that includes a first electrode, a second electrode that faces the first electrode, and a light absorbing layer that is located between the first electrode and the second electrode, and converts light into charges; a power supply that applies voltage between the first electrode and the second electrode; and a voltage controller. The light absorbing layer contains a compound having a perovskite crystal structure represented by $AMX_3$ where A represents a monovalent cation, M represents a divalent cation, and X represents a halogen anion. The voltage controller controls the voltage of the power supply so that during a first period of non-power generation, an electric current of 1 $\mu A/cm^2$ or more and 100 $\mu A/cm^2$ or less flows in the light absorbing layer in a direction opposite to a direction in which an electric current flows during power generation.

11 Claims, 5 Drawing Sheets

(51) Int. Cl.
  *H01L 51/44* (2006.01)
  *H01L 51/42* (2006.01)
  *H01L 51/00* (2006.01)
(52) U.S. Cl.
  CPC .............. *H01L 51/44* (2013.01); *H02S 40/30* (2014.12); *H01L 51/006* (2013.01); *H01L 51/0056* (2013.01); *H01L 51/0077* (2013.01); *H01L 2251/306* (2013.01); *Y02B 10/12* (2013.01); *Y02E 10/549* (2013.01)

(56) References Cited

FOREIGN PATENT DOCUMENTS

| JP | 2016-009737 | 1/2016 |
| JP | 2016-025170 | 2/2016 |
| JP | 2016-521016 | 7/2016 |

OTHER PUBLICATIONS

Julian Burschka et al., "Sequential deposition as a route to high-performance perovskite-sensitized solar cells", Nature, vol. 499, Jul. 10, 2013, pp. 316-320.
Jeong-Hyeok Im et al., "Growth of CH3NH3PbI3 cuboids with controlled size for high-efficiency perovskite solar cells", Nature Nanotechnology, vol. 9, Aug. 31, 2014, pp. 927-932.
Dongqin Bi et al., "Efficient luminescent solar cells based on tailored mixed-cation perovskites", Science Advances, vol. 2, Jan. 1, 2016, e1501170.
Monojit Bag et al., "Kinetics of Ion Transport in Perovskite Active Layers and Its Implications for Active Layer Stability", Journal of the American Chemical Society, vol. 137, Sep. 28, 2015, pp. 13130-13137.

\* cited by examiner

US 10,340,093 B2

SOLAR CELL SYSTEM AND METHOD FOR OPERATING SOLAR CELL SYSTEM

BACKGROUND

1. Technical Field

The present disclosure relates to a solar cell system that contains a perovskite compound and a method for operating the solar cell system.

2. Description of the Related Art

Recent years have seen progress in research and development of solar batteries that use, as light absorbing materials, compounds having a perovskite crystal structure represented by $AMX_3$ and crystal structure similar to the perovskite crystal structure (hereinafter these compounds are referred to as "perovskite compounds").

The structures of the solar batteries that use perovskite compounds (hereinafter referred to as "perovskite solar batteries") are disclosed in Julian Burschka and six others, "Nature" (United Kingdom), July 2013, vol. 499, pp. 316-320; Jeong-Hyeok Im and four others, "Nature Nanotechnology" (United Kingdom), November 2014, vol. 9, pp. 927-932; and Dongqin Bi and 14 others, "Science Advances" (United States), January 2016, vol. 2, e1501170, for example. A perovskite solar cell includes, for example, a transparent electrode, a layer that transports electrons, a light absorbing layer that conducts light absorption and photocharge separation, a layer that transports holes, and a current collecting electrode. A layer containing a perovskite compound (perovskite layer) is used as the light absorbing layer.

For example, Burschka describes as an example a perovskite solar cell that uses a $CH_3NH_3PbI_3$ perovskite layer as the light absorbing layer, titanium oxide as the electron-transporting material, Spiro-OMeTAD (2,2',7,7'-tetrakis(N, N-di-p-methoxyphenylamine)-9,9'-spirobifluorene) as the hole-transporting material, and a gold electrode as the current collecting electrode, and this battery achieves a conversion efficiency exceeding 15%. Im discloses a method for sequentially making $PbI_2$ to $CH_3NH_3PbI_3$ perovskite layers by a method known as a two-step method. This also made a conversion efficiency exceeding 15% possible. Bi describes an example in which a perovskite layer containing a mixture of $CH_3NH_3PbBr_3$ and $CH(NH_2)_2PbI_3$ is used as the light absorbing layer, and the conversion efficiency exceeding 20% is realized.

SUMMARY

One non-limiting and exemplary embodiment provides a solar cell system having a function of recovering the conversion efficiency degraded by light irradiation.

In one general aspect, the techniques disclosed here feature a solar cell system including a solar cell that includes a first electrode, a second electrode that faces the first electrode, and a light absorbing layer that is located between the first electrode and the second electrode, and converts light into charges; a power supply that applies voltage between the first electrode and the second electrode; and a voltage controller. The light absorbing layer contains a compound having a perovskite crystal structure represented by $AMX_3$ where A represents a monovalent cation, M represents a divalent cation, and X represents a halogen anion. The voltage controller controls the voltage of the power supply so that during a first period of non-power generation, an electric current of 1 µA/cm² or more and 100 µA/cm² or less flows in the light absorbing layer in a direction opposite to a direction in which an electric current flows during power generation.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
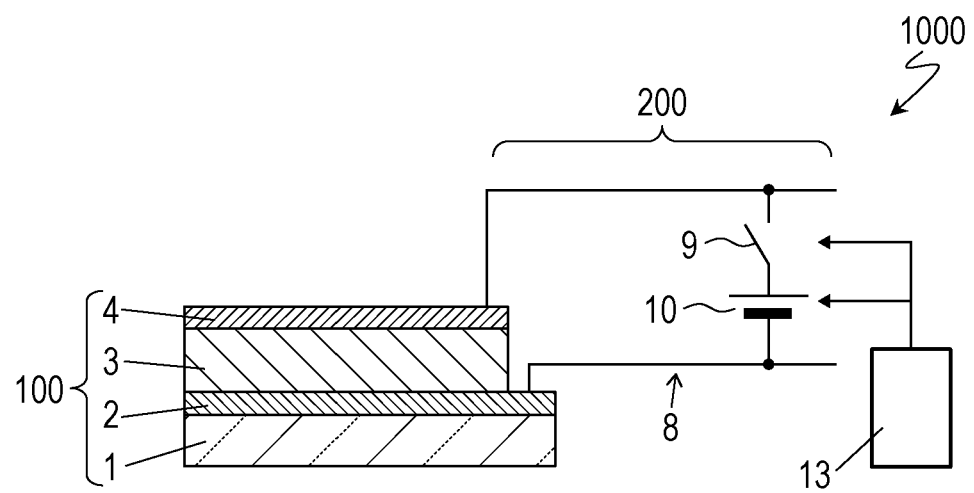
FIG. 1 is a schematic cross-sectional view illustrating an example of a solar cell system according to one embodiment.

When perovskite solar batteries are installed on the roof and the like to generate power outdoor, high light fastness as well as high conversion efficiency are required. However, as described in NPL 4, perovskite solar batteries suffer degradation of conversion efficiency with time when irradiated with sunlight.

An embodiment of the present disclosure can be summarized as follows.

[Item 1]

A solar cell system comprising a solar cell that includes a solar cell that includes a first electrode, a second electrode that faces the first electrode, and a light absorbing layer that is located between the first electrode and the second electrode, and converts light into charges; a power supply that applies voltage between the first electrode and the second electrode; and a voltage controller. The light absorbing layer contains a compound having a perovskite crystal structure represented by $AMX_3$ where A represents a monovalent cation, M represents a divalent cation, and X represents a halogen anion. The voltage controller controls the voltage of the power supply so that during a first period of non-power generation, an electric current of 1 µA/cm$^2$ or more and 100 µA/cm$^2$ or less flows in the light absorbing layer in a direction opposite to a direction in which an electric current flows during power generation.

[Item 2]

The solar cell system according to item 1, wherein the electric current that flows in the first period of the non-power generation is 1 µA/cm$^2$ or more and 5 µA/cm$^2$ or less.

[Item 3]

The solar cell system according to item 1 or 2, wherein the voltage controller controls the power supply so that a length of the first period is 0.1 to less than 10 times an accumulated value of a time during which the solar cell is irradiated with light from a time at which last application of the voltage is ended.

[Item 4]

The solar cell system according to item 1 or 2, wherein the voltage controller controls a magnitude of the voltage of the power supply and a length of the first period so that an amount of electrical power consumed by application of the voltage by the power supply is 0.001% or more and less than 1% with respect to an amount of electrical power generated by the solar cell from a time at which last application of the voltage is ended.

[Item 5]

The solar cell system according to any one of items 1 to 4, wherein the solar cell further includes an electron transporting layer that transports electrons from the light absorbing layer to the first electrode, the electron transporting layer being located between the first electrode and the light absorbing layer.

[Item 6]

The solar cell system according to any one of items 1 to 5, wherein the solar cell further includes a hole transporting layer that transports holes from the light absorbing layer to the second electrode, the hole transporting layer being located between the second electrode and the light absorbing layer.

[Item 7]

A method for operating a solar cell system that includes a solar cell, the solar cell including a first electrode, a second electrode that faces the first electrode, and a light absorbing layer that is located between the first electrode and the second electrode, converts light into charges, and contains a compound having a perovskite crystal structure represented by AMX$_3$ where A represents a monovalent cation, M represents a divalent cation, and X represents a halogen anion, the method comprising: during power generation, extracting, through the first electrode and the second electrode, electrical power generated by conversion of light into charges by the light absorbing layer, and during a first period of non-power generation, applying a voltage between the first electrode and the second electrode so that an electric current of 1 µA/cm$^2$ or more and 100 µA/cm$^2$ or less flows in the light absorbing layer in a direction opposite to a direction in which an electric current flows during the power generation.

[Item 8]

The method according to item 7, wherein the extracting the electrical power during the power generation and the applying the voltage during the non-power generation are alternately repeated.

[Item 9]

The method according to item 7 or 8, wherein the voltage is applied when an accumulated value of a time during which the solar cell is irradiated with light from a time at which last application of the voltage is ended reaches a particular time.

[Item 10]

The method according to any one of items 7 to 9, wherein a magnitude of the voltage and a length of the first period are set according to an accumulated value of a time during which the solar cell is irradiated with light from a time at which last application of the voltage is ended.

[Item 11]

The method according to any one of items 7 to 9, wherein a magnitude of the voltage and a length of the first period are set so that an amount of electrical power consumed by application of the voltage is 0.001% or more and less than 1% with respect to an amount of electrical power generated by the solar cell from a time at which last application of the voltage is ended.

Embodiments

FIG. 1 is a schematic cross-sectional view of a solar cell system 1000 according to one embodiment of the present disclosure.

The solar cell system 1000 includes a perovskite solar cell (hereinafter simply referred to as a "solar cell") 100 and a voltage application unit 200.

The solar cell 100 includes a first electrode 2 disposed on a substrate 1, a light absorbing layer (may also be referred to as a "photoelectric conversion layer") 3 that converts light into charges and is positioned on the first electrode 2, and a second electrode 4 positioned on the light absorbing layer 3.

The light absorbing layer 3 contains a compound having a perovskite crystal structure represented by the compositional formula AMX$_3$. Here, A represents a monovalent cation, M represents a divalent cation, and X represents a monovalent anion. As described below, an electron transporting layer may be provided between the first electrode 2 and the light absorbing layer 3. A hole transporting layer may be provided between the light absorbing layer 3 and the second electrode 4.

In the example illustrated in the drawing, light enters the light absorbing layer 3 from the substrate 1 side. The light absorbing layer 3 absorbs the incident light and generates excited electrons and holes. The excited electrons move to the first electrode 2. Meanwhile, holes generated in the light absorbing layer 3 move to the second electrode 4. As a result, an electric current can be extracted from the first electrode 2 serving as a negative electrode and the second electrode 4 serving as a positive electrode.

The voltage application unit 200 includes a power supply 10 and a voltage controller 13 that controls the voltage of the power supply 10. The power supply 10 is configured apply voltage to the light absorbing layer 3 through the first electrode 2 and the second electrode 4 so that an electric current flows in a direction opposite to that during power generation. In this example, the negative electrode of the power supply 10 is electrically connected to the first electrode 2 and the positive electrode of the power supply 10 is electrically connected to the second electrode 4.

The voltage controller 13 controls the voltage of the power supply 10 during a particular non-power-generation period so that an electric current of 1 µA/cm$^2$ or more and 100 µA/cm$^2$ or less relative to the area of the light absorbing layer 3 flows in the light absorbing layer 3. Here, the "area of the light absorbing layer 3" refers to the area of the light absorbing layer 3 as viewed in a direction normal to the substrate 1.

The solar cell 100 of this embodiment can be produced by the following method, for example. First, the first electrode 2 is formed on the surface of the substrate 1 by a chemical vapor deposition method, a sputtering method, or the like. Then, the light absorbing layer 3 is formed on the first electrode 2 by a coating method, a vapor deposition method, or the like. Then, the second electrode 4 is formed on the light absorbing layer 3 to obtain the solar cell 100.

The individual elements constituting the solar cell system 1000 will now be described.

<Substrate 1>

The substrate 1 is an optional constitutional element. The substrate 1 has a role of retaining the layers of the solar cell 100. The substrate 1 can be formed of a transparent material. For example, a glass substrate or a plastic substrate (including a plastic film) can be used. When the first electrode 2 has a sufficient strength, the first electrode 2 can sufficiently retain the layers and thus the substrate 1 is not necessarily provided.

<First Electrode 2>

The first electrode 2 has electrical conductivity. The first electrode 2 does not form ohmic contact with the light absorbing layer 3. Moreover, the first electrode 2 has a property to block holes from the light absorbing layer 3. The property to block holes from the light absorbing layer 3 refers to a property that allows only the electrons generated in the light absorbing layer 3 to pass through but not the holes. A material having such a property is a material that has a Fermi level lower than the energy level of the valence band lower end of the light absorbing layer 3. A specific example of such a material is aluminum.

The first electrode 2 also has a light-transmitting property. For example, the first electrode 2 transmits light in the visible range to the near infrared range. The first electrode 2 can be formed by using, for example, a transparent and electrically conductive metal oxide. Examples of such a metal oxide include indium-tin complex oxide, antimony-doped tin oxide, fluorine-doped tin oxide, zinc oxide doped with at least one of boron, aluminum, gallium, and indium, and complexes of the foregoing.

Alternatively, the first electrode 2 can be formed by using a non-transparent material by forming a pattern that transmits light. Examples of the pattern that transmits light include a line pattern, a wavy line pattern, a grid pattern, a punching-metal-like pattern in which numerous fine penetrating holes are arranged regularly or irregularly, and patterns obtained by reversing the negative-positive of these patterns. When the first electrode 2 has such a pattern, light can pass through the portions where the electrode material does not exist. Examples of the non-transparent electrode material include platinum, gold, silver, copper, aluminum, rhodium, indium, titanium, iron, nickel, tin, zinc, and an alloy containing any of the foregoing. Carbon materials having electrical conductivity can also be used.

The light transmittance of the first electrode 2 may be, for example, 50% or more or may be 80% or more. The wavelength of the light to be transmitted is dependent on the absorption wavelength of the light absorbing layer 3. The thickness of the first electrode 2 is, for example, within the range of 1 nm or more and 1000 nm or less.

<Light Absorbing Layer 3>

The light absorbing layer 3 contains a compound having a perovskite structure represented by the compositional formula $AMX_3$. Here, A represents a monovalent cation. Examples of the cation A include monovalent cations such as alkali metal cations and organic cations. More specific examples thereof include a methyl ammonium cation ($CH_3NH_3^+$), a formamidinium cation ($NH_2CHNH_2^+$), and a cesium cation ($Cs^+$). M represents a divalent cation. Examples of the cation M include divalent cations of transition metals and group 13-group 15 elements. More specific examples thereof include $Pb^{2+}$, $Ge^{2+}$, and $Sn^{2+}$. X is a monovalent anion such as a halogen anion. The sites of the cation A, the cation M, and the anion X may be occupied by two or more types of ions. Specific examples of the compound having a perovskite structure include $CH_3NH_3PbI_3$, $CH_3CH_2NH_3PbI_3$, $NH_2CHNH_2PbI_3$, $CH_3NH_3PbBr_3$, $CH_3NH_3PbCl3$, $CsPbI_3$, and $CsPbBr_3$.

The thickness of the light absorbing layer 3 is, for example, 100 nm or more and 1000 nm or less. The perovskite layer included in the light absorbing layer 3 can be formed by a coating method using a solution, a co-deposition method, or the like.

<Second Electrode 4>

The second electrode 4 has electrical conductivity. The second electrode 4 does not make ohmic contact with the light absorbing layer 3. Moreover, the second electrode 4 has a property to block electrons from the light absorbing layer 3. The property to block electrons from the light absorbing layer 3 refers to a property that allows only the holes generated in the light absorbing layer 3 to pass through, but not the electrons. A material having such a property is a material having a Fermi level higher than the energy level of the conduction band upper end of the light absorbing layer 3. Specific examples of the material include gold and carbon materials such as graphene.

Of the first electrode 2 and the second electrode 4, at least the electrode on the light incident side may have a light-transmitting property. Thus, when the second electrode 4 has a light-transmitting property, the first electrode 2 does not have to have a light-transmitting property. In the example illustrated in the drawing, the first electrode 2 serves as a negative electrode and the second electrode 4 serves as a positive electrode; alternatively, the first electrode 2 may serve as a positive electrode and the second electrode 4 may serve as a negative electrode.

<Voltage Application Unit 200>

The voltage application unit 200 applies voltage between the first electrode 2 and the second electrode 4 of the solar cell 100. As a result, an electric current can flow in the light absorbing layer 3 in a direction opposite to that during power generation.

The voltage application unit 200 includes, for example, a circuit 8, a switch 9, the power supply 10, and the voltage controller 13.

The power supply 10 is a device that has a function of applying a DC voltage to exterior. Examples of the power supply 10 include, in addition to power supply devices that can apply any desired voltage, chemical batteries such as primary batteries and secondary batteries, and physical batteries such as solar batteries and wind power generators. Alternatively, the power generated in the solar cell 100 may be utilized in the voltage application unit 200. For example, the power supply 10 may include a storage battery that stores the electrical power generated in the solar cell 100.

The circuit 8 connects the negative side of the power supply 10 to the first electrode 2, and the positive side of the power supply 10 to the second electrode 4. The circuit 8 includes the switch 9. By switching the switch 9, application of voltage to the solar cell 100 can be controlled.

The voltage controller 13 is a unit that controls the magnitude of the voltage applied to the solar cell 100, the length of time during which the voltage is applied, the timing of starting application of voltage, etc. The voltage controller 13 is, for example, connected to the power supply 10 and the switch 9, and controls the magnitude of the voltage applied from the power supply 10 to the solar cell 100 and the switching of the switch 9.

In this embodiment, the voltage controller 13 controls the voltage of the power supply 10 so that, during a particular non-power-generation period, an electric current of a particular magnitude flows in the light absorbing layer 3 in a direction opposite to that during power generation. For the purposes of this specification, the operation of applying the voltage so that an electric current flows in the light absorbing layer 3 in a direction opposite to that during power generation is referred to as the "voltage application operation". Moreover, the electric current flowing in the light absorbing layer 3 by the voltage application operation is referred to as "recovery current", and the electric current extracted from the solar cell 100 during power generation is referred to as "output current" so as to distinguish between the recovery current and the output current.

The voltage controller 13 may control the voltage application unit 200 so that voltage application to the solar cell 100 is started when the accumulated value of the amount of time the solar cell 100 is irradiated with light (hereinafter this value is referred to as the "accumulated irradiation time") reaches a particular time. Moreover, the voltage application unit 200 may be controlled so that application of voltage is ended after elapse of a particular time (hereinafter this time is referred to as the "voltage application time") after the voltage application operation is started. The "accumulated irradiation time" refers to the accumulated value of irradiation time starting from the moment the solar cell system 1000 started operation. When the voltage application operation is previously conducted at least once, the "accumulated irradiation time" refers to the accumulated value of the irradiation time starting from the moment the immediately previous voltage application operation ended. The accumulated irradiation time may be accumulated with a non-irradiation period in between. In other words, when the irradiation time and the non-irradiation time co-exist, the accumulated irradiation time is accumulated by excluding the non-irradiation time. The irradiation time described here is the time during which light having an illuminance (for example, 1 mW/cm$^2$ or more) sufficient for operating the solar cell 100 is applied, and does not include the time during which the solar cell 100 is irradiated with light having an extremely low illuminance.

Figure 2:
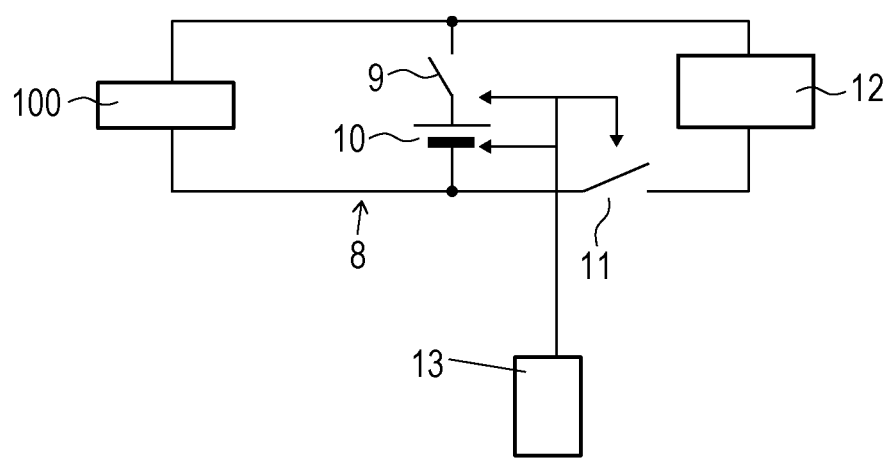
FIG. 2 is a schematic cross-sectional view illustrating another example of a solar cell system according to one embodiment.

As illustrated in FIG. 2, the circuit 8 may be connected to an external circuit 12 for extracting electrical power from the solar cell 100 through another switch 11. In this manner, by switching between the switch 9 and the switch 11, the voltage controller 13 can stop extraction of the generated electrical power from the solar cell 100 and start the voltage application operation when the accumulated irradiation time reaches a particular time.

The solar cell system 1000 of this embodiment has the following effects.

As described in Monojit Bag and eight others, "Journal of the American Chemical Society" (United States), 2015, vol. 137, pp. 13130-13137, perovskite solar batteries have an issue of degradation of conversion efficiency due to long use. This is because the distribution of the ions constituting the perovskite compound in the light absorbing layer 3 becomes uneven. In contrast, according to this embodiment, the unevenness in the ion distribution in the light absorbing layer 3 can be reduced by applying voltage to the light absorbing layer 3. As a result, the conversion efficiency of the solar cell 100 can be recovered. This is described below with reference to the drawings.

Figure 3A:
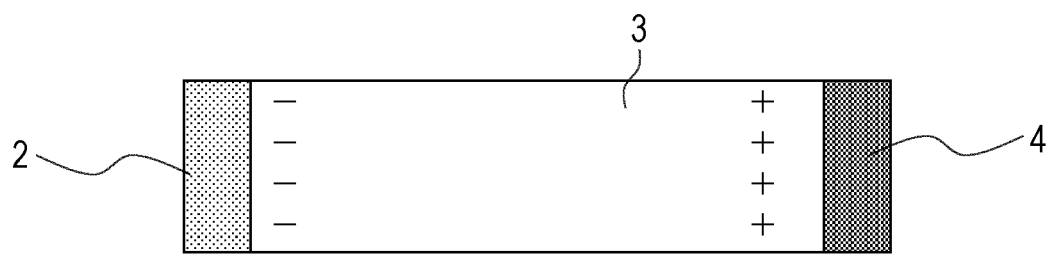
FIG. 3A is a schematic cross-sectional view illustrating the state of ions in a light absorbing layer of the solar cell system.
Figure 3B:
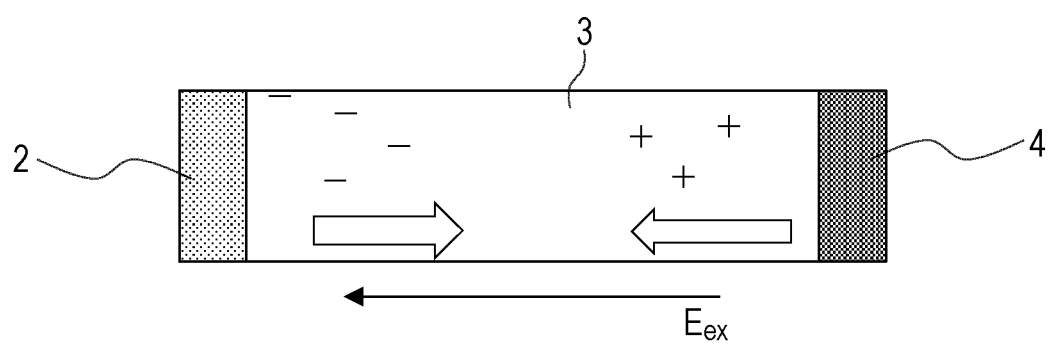
FIG. 3B is a schematic cross-sectional view illustrating the state of ions in the light absorbing layer of the solar cell system.

FIGS. 3A and 3B are schematic cross-sectional views illustrating the state of charges in the light absorbing layer 3 of the solar cell system 1000. Here, an example in which the light absorbing layer 3 contains $CH_3NH_3PbI_3$ as the perovskite compound is described. In $CH_3NH_3PbI_3$, A sites of $AMX_3$ are occupied by methyl ammonium ions ($CH_3NH_3^+$), B sites are occupied by lead ions ($Pb^{2+}$), and X sites are occupied by iodide ions ($I^-$).

When the time during which the light absorbing layer 3 is irradiated with light is long, methyl ammonium ions leave the perovskite skeleton of $CH_3NH_3PbI_3$ and diffuse and move toward the positive electrode. Thus, as illustrated in FIG. 3A, the ion distribution within the light absorbing layer becomes uneven. The unevenness in the ion distribution is a factor that degrades the conversion efficiency of the solar cell 100. When the distribution of the ions in the light absorbing layer becomes uneven, it is difficult to recover the even state by ion diffusion only even when the light absorbing layer 3 is left to stand without being irradiated with light. In order to return the ion distribution to a state close to the even state, a longer time than the time taken to make the distribution uneven may be needed.

In this embodiment, as illustrated in FIG. 3B, a voltage $E_{ex}$ is applied from outside to the light absorbing layer 3 having an uneven ion distribution so that electric current flows in a direction opposite to that during power generation. As a result, methyl ammonium ions that have existed in a high concentration near the positive electrode move toward the negative electrode. Thus, unevenness in the ion distribution can be rapidly resolved. As a result, the conversion efficiency that has degraded due to long use can be recovered at least partly.

The voltage $E_{ex}$ applied to the light absorbing layer 3 is set to a voltage at which an electric current of 1 μA/cm$^2$ or more and 100 μA/cm$^2$ or less flows with respect to the area of the first electrode 2. As long as the electric current is 1 μA/cm$^2$ or more, the unevenness in the ion distribution can be reduced in a shorter voltage application time, and thus, the conversion efficiency of the solar cell 100 can be rapidly recovered. As long as the electric current is 100 μA/cm$^2$ or less, the conversion efficiency can be recovered without increasing the amount of electrical power of the power supply 10 needed to recover the conversion efficiency.

The time required to recover the conversion efficiency of the solar cell 100 is substantially in inverse proportion to the magnitude of the electric current. When the solar cell 100 is not generating power, the amount of change in voltage $E_{ex}$ relative to the amount of change in electric current is small. Thus, the smaller the value of the electric current, the smaller the electrical power of the power supply 10 needed to recover the conversion efficiency. Due to this reason, the electric current flowing in the light absorbing layer 3 is more desirably 1 μA/cm$^2$ or more and 5 μA/cm$^2$ or less with respect to the area of the first electrode 2.

The voltage application time can be, for example, set depending on the accumulated irradiation time. The voltage application time may be set within the range of 0.1 to less than 10 times the length of the accumulated irradiation time, although this depends on the magnitude of the recovery current. As long as the voltage application time is 0.1 times the length of the accumulated irradiation time or longer, the unevenness in the ion distribution, which is the factor for degradation of the conversion efficiency, can be more reliably resolved, and the recovery rate of the conversion efficiency can be increased. As long as the voltage application time is shorter than 10 times the length of the accumulated irradiation time, the increase in the amount of electrical power used by the power supply 10 during voltage application operation can be suppressed.

As described above, according to this embodiment, even when the conversion efficiency of the solar cell 100 is degraded by irradiation with light, the conversion efficiency can be recovered by a simple procedure without requiring further work, such as disassembling and assembling the solar cell 100.

(Method for Operating Solar Cell System 1000)

Figure 4:
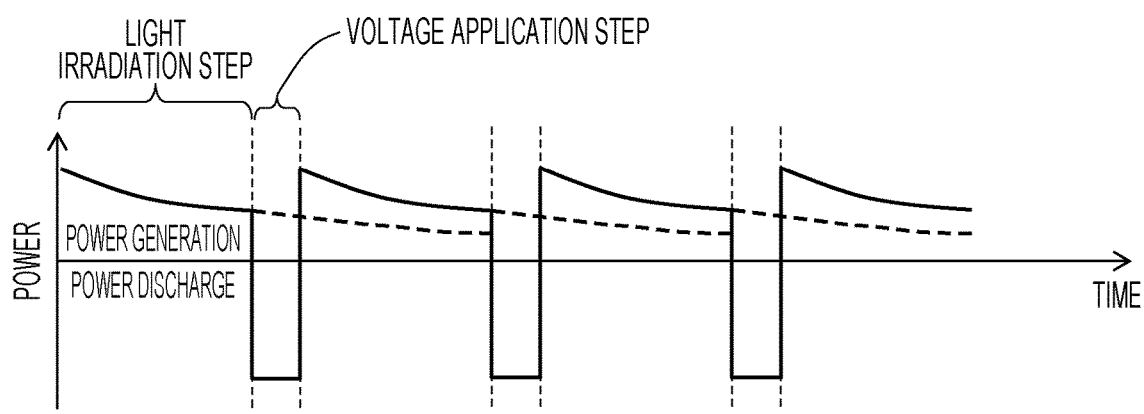
FIG. 4 is a diagram illustrating an example of a method for operating the solar cell system according to one embodiment.

FIG. 4 is a diagram illustrating an example of a method for operating the solar cell system 1000.

The method for operating the solar cell system 1000 includes, for example, a light irradiation step and a voltage application step. In the light irradiation step, the solar cell is irradiated with light. Furthermore, the electrical power generated by the solar cell by irradiation with light is extracted to outside the solar cell. The voltage application step is conducted after the light irradiation step so as to recover degradation of the conversion efficiency caused by light irradiation. In the voltage application step, the voltage is applied to the solar cell 100 so that a particular recovery current flows in a direction opposite to that during power generation. The time taken for one voltage application step (voltage application time) is appropriately adjusted on the basis of the accumulated irradiation time before the voltage application step, the magnitude of the recovery current, etc. The light irradiation step and the voltage application step may be repeated. The voltage application step is desirably conducted while the solar cell 100 is not irradiated with light, but can be conducted under irradiation with light.

The solar cell system 1000 may further include a device for detecting the accumulated irradiation time. The voltage application step may be started when the accumulated irradiation time reaches a preset time. In addition or instead, the voltage application step may be conducted within a time zone during which the battery is not irradiated with light. In such a case, the magnitude of the recovery current and/or the voltage application time may be appropriately set on the basis of the accumulated irradiation time.

(Other Structures of Solar Cell System)

The structure of the solar cell of this embodiment is not limited to the structure illustrated in FIG. 1.

Figure 5:
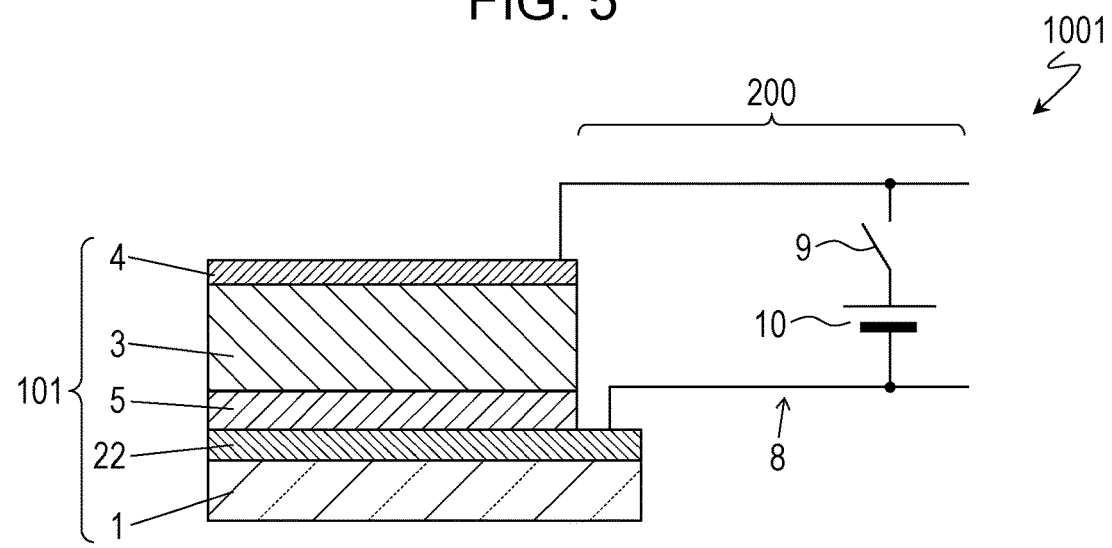
FIG. 5 is a schematic cross-sectional view illustrating another example of the solar cell system according to one embodiment.
Figure 6:
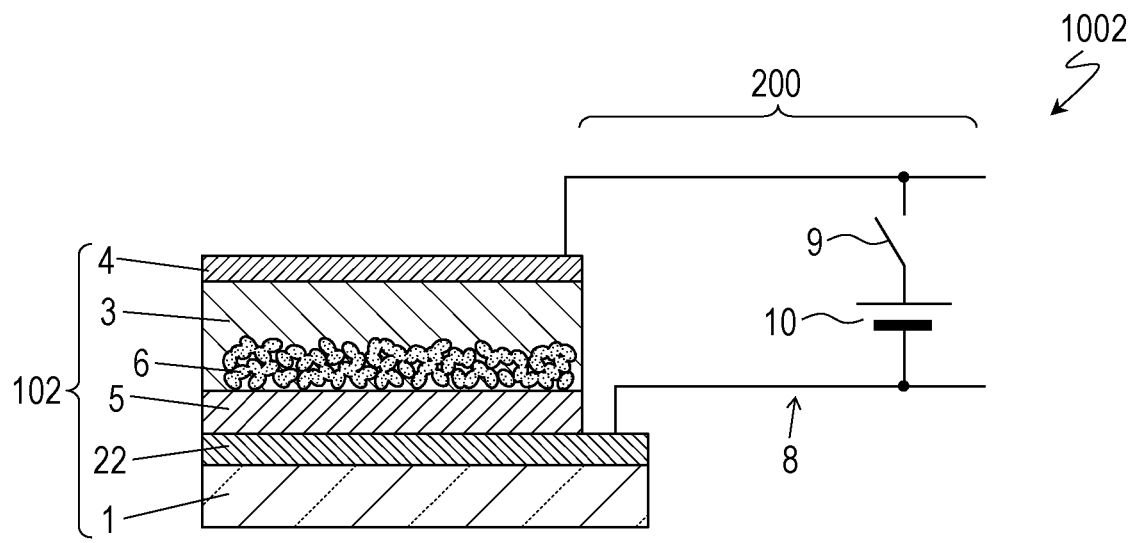
FIG. 6 is a schematic cross-sectional view illustrating yet another example of the solar cell system according to one embodiment.
Figure 7:
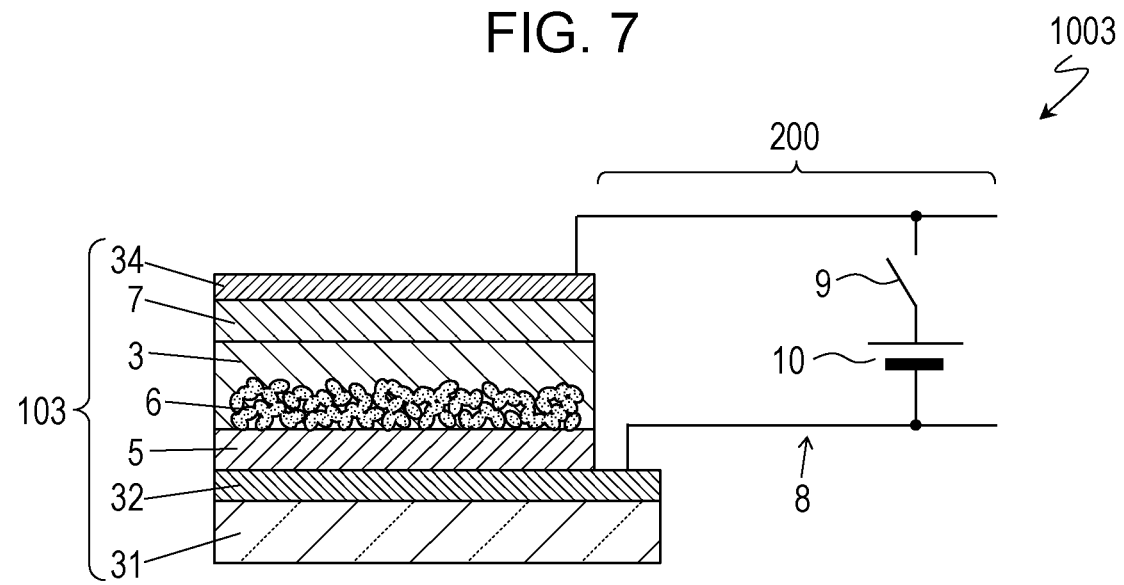
FIG. 7 is a schematic cross-sectional view illustrating yet another example of the solar cell system according to one embodiment.

FIGS. 5 to 7 are schematic cross-sectional views illustrating other examples of the solar cell system of this embodiment. These systems differ from the system illustrated in FIG. 1 in the structure of the solar cell. The structures other than the solar cell are identical.

A solar cell system 1001 illustrated in FIG. 5 includes, on a substrate 1, a solar cell 101, and the solar cell 101 includes a first electrode 22 an electron transporting layer 5, a light absorbing layer 3, and a second electrode 4. The solar cell 101 differs from the solar cell 100 illustrated in FIG. 1 in that the solar cell 101 includes the electron transporting layer.

The constitutional elements of the solar cell 101 will now be specifically described. The descriptions of the constitutional elements having the same functions and structures as those of the solar cell 100 are omitted as appropriate.

The basic mechanism and effects of the solar cell 101 of this embodiment will now be described.

When the solar cell 101 is irradiated with light, the light absorbing layer 3 absorbs light and generates excited electrons and holes. The excited electrons move to the first electrode 22 through the electron transporting layer 5. The holes generated in the light absorbing layer 3 move to the second electrode 4. As a result, an electric current can be extracted from the solar cell 101 with the first electrode 22 functioning as a negative electrode and the second electrode 4 functioning as a positive electrode.

This embodiment also has the same effects as those of the solar cell 100.

In this embodiment, the electron transporting layer 5 is provided. Thus, the first electrode 22 does not have to have a property to block holes from the light absorbing layer 3. Thus, the flexibility of selecting the material for the first electrode 22 is increased.

The solar cell 101 of this embodiment can be produced by the same method as that for the solar cell 100. The electron transporting layer 5 is formed on the first electrode 22 by a sputtering method or the like.

The individual elements constituting of the solar cell 101 will now be described specifically.

<First Electrode 22>

The first electrode 22 has electrical conductivity. The first electrode 22 may have the same structure as the first electrode 2. In this embodiment, since the electron transporting layer 5 is used, the first electrode 22 does not have to have a property to block holes from the light absorbing layer. In other words, the material for the first electrode 22 may be a material that makes ohmic contact with the light absorbing layer.

The first electrode 22 has a light-transmitting property. For example, the first electrode 22 transmits light in the visible range to the near infrared range. The first electrode 22 can be formed by using a transparent and electrically conductive metal oxide. Examples of such a metal oxide include indium-tin complex oxide, antimony-doped tin oxide, fluorine-doped tin oxide, zinc oxide doped with at least one of boron, aluminum, gallium, and indium, and complexes of the foregoing.

Alternatively, a non-transparent material can be used as the material for the first electrode 22. In such a case, as with the first electrode 2, the first electrode 22 is formed to have a pattern that transmits light. Examples of the non-transparent electrode material include platinum, gold, silver, copper, aluminum, rhodium, indium, titanium, iron, nickel, tin, zinc, and an alloy containing any of the foregoing. Carbon materials having electrical conductivity can also be used.

The light transmittance of the first electrode 22 may be, for example, 50% or more or may be 80% or more. The wavelength of the light to be transmitted is dependent on the absorption wavelength of the light absorbing layer 3. The thickness of the first electrode 22 is, for example, 1 nm or more and 1000 nm or less.

<Electron Transporting Layer 5>

The electron transporting layer 5 contains a semiconductor. The electron transporting layer 5 may be a semiconductor having a bandgap of 3.0 eV or more. When a semiconductor having a bandgap of 3.0 eV or more is used to form the electron transporting layer 5, visible light and infrared light can be transmitted to the light absorbing layer 3. Examples of the semiconductor include organic or inorganic n-type semiconductors.

Examples of the organic n-type semiconductors include imide compounds, quinone compounds, and fullerene and derivatives thereof. Examples of the inorganic n-type semiconductor include oxides of metal elements and perovskite oxides. Examples of the oxides of metal elements include oxides of Cd, Zn, In, Pb, Mo, W, Sb, Bi, Cu, Hg, Ti, Ag, Mn, Fe, V, Sn, Zr, Sr, Ga, and Cr. A more specific example is $TiO_2$. Examples of the perovskite oxides include $SrTiO_3$ and $CaTiO_3$.

The electron transporting layer 5 may be formed of a substance having a bandgap larger than 6 eV. Examples of the substance having a bandgap larger than 6 eV include halogenated alkali metals and alkaline earth metals such as lithium fluoride and calcium fluoride, alkali metal oxides such as magnesium oxide, and silicon dioxide. In this case, in order to ensure the electron transporting property of the electron transporting layer 5, the electron transporting layer 5 is configured to be 10 nm or less, for example.

The electron transporting layer 5 may include two or more layers formed of materials different from one another. The electron transporting layer and the light absorbing layer may co-exist in some part of the interface.

A solar cell system 1002 illustrated in FIG. 6 includes a solar cell 102 that differs from the solar cell 101 illustrated in FIG. 5 in that a porous layer 6 is provided. The descriptions of the constitutional elements having the same functions and structures as those of the solar cell 101 are omitted as appropriate.

In the solar cell 102, a first electrode 22, an electron transporting layer 5, a porous layer 6, a light absorbing layer 3, and a second electrode 4 are sequentially stacked on a substrate 1 in this order. The porous layer 6 contains a porous body. The porous body contains pores. The solar cell 102 does not have to include the substrate 1.

The pores in the porous layer 6 are connected from the part that is in contact with the light absorbing layer 3 to the part in contact with the electron transporting layer 5. In this manner, the material for the light absorbing layer 3 fills the pores of the porous layer 6, and can reach the surface of the electron transporting layer 5. Thus, the light absorbing layer 3 and the electron transporting layer 5 are in contact with each other, and electrons can be directly exchanged.

Once the solar cell 102 is irradiated with light, the light absorbing layer 3 absorbs light and generates excited electrons and holes. The excited electrons move to the first electrode 22 through the electron transporting layer 5. The holes generated in the light absorbing layer 3 move to the second electrode 4. As a result, an electric current can be extracted from the solar cell 102 with the first electrode 22 functioning as a negative electrode and the second electrode 4 functioning as a positive electrode.

Since the porous layer 6 is provided on the electron transporting layer 5, an advantage is that the light absorbing layer 3 can be easily formed. In other words, because the porous layer 6 is provided, the material for the light absorbing layer 3 penetrates the pores in the porous layer 6, and the porous layer 6 functions as a scaffold of the light absorbing layer 3. Thus, the material for the light absorbing layer 3 is rarely repelled by the surface of the porous layer 6 and rarely aggregates. Thus, the light absorbing layer 3 can be formed as an even film.

Since light is diffused by the porous layer 6, an anticipated advantage is that the optical path length of the light passing through the light absorbing layer 3 is increased. When the optical path length is increased, the amounts of electrons and holes generated in the light absorbing layer 3 are expected to increase.

The solar cell 102 can be produced by the same method as that for the solar cell 101. The porous layer 6 is formed on the electron transporting layer 5 by, for example, a coating method.

<Porous Layer 6>

The porous layer 6 serves as a foundation for forming the light absorbing layer 3. The porous layer 6 does not obstruct light-absorption of the light absorbing layer 3 or the electron movement from the light absorbing layer 3 to the electron transporting layer 5.

The porous layer 6 contains a porous body. An example of the porous body is a porous body having insulating or semiconductor particles that are connected to one another. Examples of the insulating particles that can be used include particles of aluminum oxide and silicon oxide. Inorganic semiconductor particles can be used as the semiconductor particles. Examples of the inorganic semiconductor that can be used include oxides of metal elements, perovskite oxides of metal elements, sulfides of metal elements, and metal chalcogenides. Examples of the oxides of the metal elements include oxides of Cd, Zn, In, Pb, Mo, W, Sb, Bi, Cu, Hg, Ti, Ag, Mn, Fe, V, Sn, Zr, Sr, Ga, Si, and Cr. A more specific example is $TiO_2$. Examples of the perovskite oxides of metal elements include $SrTiO_3$ and $CaTiO_3$. Examples of the sulfides of the metal elements include CdS, ZnS, $In_2S_3$, PbS, $Mo_2S$, $WS_2$, $Sb_2S_3$, $Bi_2S_3$, $ZnCdS_2$, and $Cu_2S$. Examples of the metal chalcogenides include CdSe, $In_2Se_3$, $WSe_2$, HgS, PbSe, and CdTe.

The thickness of the porous layer 6 is desirably 0.01 μm or more and 10 μm or less, and more desirably 0.1 μm or more and 1 μm or less. The larger the surface roughness of the porous layer 6, the more desirable. Specifically, the surface roughness coefficient given by effective area/projection area is desirably 10 or more and more desirably 100 or more. The projection area refers to the area of the shadow formed behind an object when the object is irradiated with light from right front. The effective area is the actual surface area of the object. The effective area can be calculated from the volume obtained from the projection area and thickness of the object and the specific surface area and bulk density of the material constituting the object.

A solar cell system 1003 illustrated in FIG. 7 differs from the solar cell 102 illustrated in FIG. 6 in that a hole transporting layer 7 is provided. The constitutional elements having the same functions and structures as those of the solar cell 102 are represented by the same reference numerals as those of the solar cell 102, and the descriptions therefor are omitted as appropriate.

In a solar cell 103, a first electrode 32, an electron transporting layer 5, a porous layer 6, a light absorbing layer 3, a hole transporting layer 7, and a second electrode 34 are sequentially stacked on a substrate 31 in this order. The solar cell 103 does not have to include the substrate 31.

The basic mechanism and effects of the solar cell 103 will now be described.

When the solar cell 103 is irradiated with light, the light absorbing layer 3 absorbs light and generates excited electrons and holes. The excited electrons move to the electron transporting layer 5. The holes generated in the light absorbing layer 3 move into the hole transporting layer 7. The electron transporting layer 5 is connected to the first electrode 32, and the hole transporting layer 7 is connected to the second electrode 34. As a result, an electric current can be extracted from the solar cell 103 with the first electrode 32 functioning as a negative electrode and the second electrode 34 functioning as a positive electrode.

The solar cell 103 has the same effects as those of the solar cell 100.

The solar cell 103 includes the hole transporting layer 7 between the light absorbing layer 3 and the second electrode 34. Thus, the second electrode 34 does not have to have a property to block electrons from the light absorbing layer 3. Thus, the flexibility of selecting the material for the second electrode 34 is increased.

The solar cell 103 can be produced by the same method as that for the solar cell 100. The hole transporting layer is formed on the light absorbing layer by a coating method or the like.

The individual elements constituting of the solar cell 103 will now be described specifically.

<Substrate 31>

The substrate 31, which is an optional constitutional element, can have the same structure as the substrate 1. When the second electrode has a light-transmitting property, the substrate 31 can be produced by using a non-transparent material. For example, a metal, a ceramic, or a resin material having a low light-transmitting property can be used.

<First Electrode 32 and Second Electrode 34>

As described above, the second electrode 34 does not have to have a property to block electrons from the light absorbing layer 3. In other words, the material for the second electrode 34 may be a material that makes ohmic contact with the light absorbing layer 3. Thus, the second electrode 34 can be formed to have a light-transmitting property.

At least one of the first electrode 32 and the second electrode 34 has a light-transmitting property. The electrode having a light-transmitting property may have the same structure as the first electrode 22.

One of the first electrode 32 and the second electrode 34 does not have to have a light-transmitting property. The electrode that does not have a light-transmitting property can be formed by using a non-transparent material selected from among the materials listed as the material for the first electrode 22. There is no need to form a region where the electrode material is not present in the electrode that does not have a light-transmitting property.

<Hole Transporting Layer 7>

The hole transporting layer 7 is a layer that transports holes from the light absorbing layer 3 to the second electrode 4. The hole transporting layer 7 is, for example, formed of an organic substance or an inorganic semiconductor. The hole transporting layer 7 may include two or more layers formed of materials different from one another. A portion of the hole transporting layer 7 may co-exist with the light absorbing layer 3.

Examples of the organic substance include phenylamine and triphenylamine derivatives that have tertiary amine in the skeleton, and PEDOT compounds having a thiophene structure. The molecular weight is not particularly limited, and the organic substance may be a polymer. When the hole transporting layer 7 is formed by using an organic substance, the thickness of the hole transporting layer 7 is desirably 1 nm or more and 1000 nm or less and more desirably 100 nm or more and 500 nm or less. As long as the thickness is within this range, a sufficient hole transporting property can be offered. Moreover, since the low resistance can be maintained, photovoltaic generation can be carried out highly efficiently.

An example of the inorganic semiconductor is a p-type semiconductor. Examples of the p-type semiconductor include CuO, $Cu_2O$, CuSCN, molybdenum oxide, and nickel oxide. When the hole transporting layer 7 is formed by using an inorganic semiconductor, the thickness of the hole transporting layer 7 is desirably 1 nm or more and 1000 nm or less and more desirably 10 nm or more and 50 nm or less. As long as the thickness is within this range, a sufficient hole transporting property can be offered. Moreover, since the low resistance can be maintained, photovoltaic generation can be carried out highly efficiently.

A coating method or a printing method can be employed as a method for forming the hole transporting layer 7. Examples of the coating method include a doctor blade method, a bar coating method, a spraying method, a dip coating method, and a spin coating method. An example of the printing method is a screen printing method. If needed, a film formed of a mixture may be pressurized or baked. When the material for the hole transporting layer 7 is an organic low-molecular-weight compound or an inorganic semiconductor, a vacuum vapor deposition method or the like can be employed to form the hole transporting layer 7.

The hole transporting layer 7 may contain a supporting electrolyte and a solvent. The supporting electrolyte and the solvent have an effect of stabilizing holes in the hole transporting layer 7.

Examples of the supporting electrolyte include ammonium salts and alkali metal salts. Examples of the ammonium salts include tetrabutylammonium perchlorate, tetraethylammonium hexafluorophosphate, imidazolium salts and pyridinium salts. Examples of the alkali metal salts include lithium perchlorate and potassium tetrafluoroboron.

The solvent contained in the hole transporting layer 7 desirably has excellent ion conductivity. Although an aqueous solvent and an organic solvent can be used, an organic solvent is desirable to further stabilize the solute. Specific examples thereof include heterocyclic compound solvents such as tert-butylpyridine, pyridine, and n-methylpyrrolidone.

An ionic liquid, alone or as a mixture with other solvents, can be used as the solvent. An ionic liquid is desirable for its low volatility and high flame retardancy. Examples of the ionic liquid include imidazolium ionic liquid such as 1-ethyl-3-methylim idazolium tetracyanoborate, pyridine ionic liquid, alicyclic amine ionic liquid, aliphatic amine ionic liquid, and azonium amine ionic liquid.

EXAMPLES

The present disclosure will now be described specifically through examples. Here, a perovskite solar cell system for evaluation (hereinafter "system for evaluation") was prepared and its effects were evaluated.

<Preparation of System for Evaluation>

A system that has substantially the same structure as the solar cell system 1003 illustrated in FIG. 7 was prepared. The constitutional elements of the system for evaluation were as follows:

Substrate: glass substrate, thickness: 0.7 mm (produced by Nippon Sheet Glass Co. Ltd.)

First electrode: transparent electrode, fluorine-doped $SnO_2$ layer (surface resistance: 10 Ω/square)

Electron transporting layer: $TiO_2$, thickness: 30 nm

Porous layer: porous titanium oxide, thickness: 0.2 μm

Light absorbing layer: $CH_3NH_3PbI_3$, thickness: 0.5 μm

Hole transporting layer: Spiro-OMeTAD (produced by Merck)

Second electrode: Au, thickness: 100 nm

The system for evaluation was prepared as follows.

A conductive glass substrate (25 mm×25 mm) having a thickness of 0.7 mm was used as the substrate. A fluorine-doped $SnO_2$ layer was disposed on the substrate to serve as the first electrode. Next, a titanium oxide layer having a thickness of about 30 nm was formed on the first electrode by a sputtering method so as to form the electron transporting layer.

Next, high-purity titanium oxide powder having an average primary particle diameter of 20 nm was dispersed in ethyl cellulose so as to prepare a titanium oxide paste for screen printing. The titanium oxide paste was applied to the electron transporting layer and dried. The dried paste was baked in air at 500° C. for 30 minutes to form a porous titanium oxide layer (titanium coat) having a thickness of 0.2 µm and serving as the porous layer.

Next, a dimethyl sulfoxide (DMSO) solution containing 1 mol/L of $PbI_2$ and 1 mol/L of methyl ammonium was prepared. This solution was applied to the porous layer by spin coating. Subsequently, the substrate 31 was heat-treated on a 130° C. hot plate to prepare a perovskite layer, $CH_3NH_3PbI_3$, that served as the light absorbing layer 3. The thickness of the light absorbing layer 3 was 500 nm.

A chlorobenzene solution containing 60 mmol/L of Spiro-OMeTAD, 30 mmol/L of LiTFSI (lithiumbis(fluorosulfonyl)imide), 200 mmol/L of tBP (tert-butylpyridine), and 1.2 mmol/L of a Co complex (FK209 produced by Dyesol Ltd.) was prepared. This solution was applied to the light absorbing layer by spin coating to prepare a hole transporting layer.

Au is vapor-deposited to 100 nm on the hole transporting layer to form a second electrode.

Next, the first electrode and the second electrode of the solar cell were connected to an electrochemical analyzer (produced by BAS Inc.). As a result, a system for evaluation capable of applying desired voltage to a perovskite solar cell was configured.

<Evaluation Testing Method and Results>

Evaluation tests of Examples 1 to 3 and Comparative Example 1 to 6 were conducted by using the system for evaluation.

Example 1

First, as the light irradiation step, light having an illuminance of 100 mW/cm² was applied to the solar cell of the system for evaluation by using a solar simulator. Under this condition, the change in value of the current output from the solar cell over time was measured. Light irradiation was stopped after 60 minutes of light irradiation.

Next, as the voltage application step, the electrochemical analyzer was used to apply a voltage to the solar cell for 60 minutes so that a 100 µA/cm² recovery current flowed in a direction opposite to that during power generation.

The light irradiation step and the voltage application step described above were conducted three times.

Figure 8:
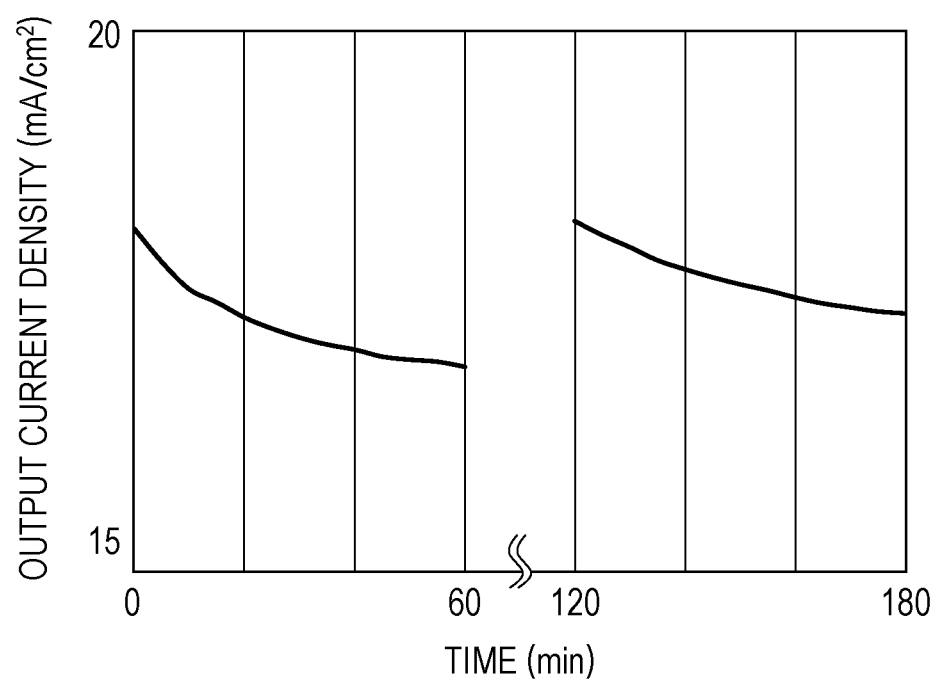
FIG. 8 is a graph indicating the change in output current value of a solar cell over time in Example 1.

FIG. 8 is a graph indicating the change in output current value over time in the light irradiation step.

The amount of electrical power consumed in one voltage application step (hereinafter referred to as "electrical power consumption in voltage application step") was calculated from the following equation:

(electrical power consumption in voltage application step)=(applied voltage)×(electric current)×(voltage application time)

Furthermore, the amount of electrical power generated by the system when 60 minutes of the light irradiation step and 60 minutes of the voltage application step were performed three times was calculated from the following equation:

(Amount of electrical power generated by system)= (amount of electrical power generated by solar cell due to light irradiation)−(electrical power consumption in voltage application step)

The results are indicated in Table.

Example 2

In Example 2, the evaluation testing was performed as in Example 1 except that, in the voltage application step, a voltage that caused a 5 µA/cm² recovery current to flow was applied for 60 minutes.

Example 3

In Example 3, the evaluation testing was performed as in Example 1 except that, in the voltage application step, a voltage that caused a 1 µA/cm² recovery current to flow was applied for 60 minutes.

Comparative Example 1

In Comparative Example 1, the evaluation testing was performed as in Example 1 except that, in the voltage application step, a voltage that caused a 1 mA/cm² recovery current to flow was applied for 60 minutes.

Comparative Example 2

In Comparative Example 2, the evaluation testing was performed as in Example 1 except that, in the voltage application step, a voltage that caused a 0.1 µA/cm² recovery current to flow was applied for 60 minutes.

Comparative Example 3

In Comparative Example 3, the evaluation testing was performed as in Example 1 except that, in the voltage application step, a voltage that caused a 100 µA/cm² recovery current to flow was applied for 10 hours.

Comparative Example 4

In Comparative Example 4, the evaluation testing was performed as in Example 1 except that, in the voltage application step, a voltage that caused a 1 µA/cm² recovery current to flow was applied for 100 seconds.

Comparative Example 5

In Comparative Example 5, after the light irradiation step was performed as in Example 1, the voltage application step was skipped, and the next light irradiation step was performed. The 60-minutes light irradiation step was performed continuously for three times, and the amount of electrical power generated by the system was calculated.

Comparative Example 6

In Comparative Example 6, after a light irradiation step was performed for 2 hours under the same irradiation conditions as in Example 1, the voltage application step was skipped and the next light irradiation step was performed for 2 hours. As such, 2 hours of the light irradiation step was continuously performed three times, and the amount of electrical power generated by the system was calculated. Comparative Example 6 represents the condition in which power is constantly generated even during the voltage application step in Example 1.

The evaluation results for Examples 1 to 3 and Comparative Examples 1 to 6 are summarized in Table.

TABLE

| | Recovery current ($\mu$A/cm$^2$) | Voltage application time (sec) | Electrical power consumption (mJ/cm$^2$) | Amount of electrical power generated by system (J/cm$^2$) |
|---|---|---|---|---|
| Example 1 | 100 | 3600 | 306 | 133 |
| Example 2 | 5 | 3600 | 144 | 135 |
| Example 3 | 1 | 3600 | 2.8 | 135 |
| Comparative Example 1 | 1000 | 3600 | 3600 | 120 |
| Comparative Example 2 | 0.1 | 3600 | 0.25 | 100 |
| Comparative Example 3 | 100 | 36000 | 30600 | 45 |
| Comparative Example 4 | 1 | 100 | 0.78 | 100 |
| Comparative Example 5 | 0 | 0 | 0 | 80 |
| Comparative Example 6 | 0 | 0 | 0 | 120 |

The results of Examples 1 to 3 and Comparative Examples 5 and 6 indicate that even if power generation is continued without conducting the voltage application step (Comparative Examples 5 and 6), the amount of power generated by the system is not as high as in Examples 1 to 3. This indicates that the conversion efficiency of the solar cell is recovered by the voltage application step, and the amount of the power generated by system can be improved as a result.

The results of Examples 1 to 3 and Comparative Examples 1 and 2 confirm that appropriately controlling the magnitude of the recovery current improves the amount of power generated by the system. Specifically, the electrical power consumption in the voltage application step increases if the recovery current is excessively large (Comparative Example 1), and the amount of power generated by the system decreased as a result. In contrast, when the recovery current is excessively small (Comparative Example 2), the electrical power consumption in the voltage application step can be decreased, but a sufficient recovery effect cannot be obtained. Thus, the amount of power generated by the system was not high.

Furthermore, the results of Examples 1 to 3 and Comparative Examples 3 and 4 confirm that appropriately controlling the voltage application time can improve the amount of power generated by the system. Specifically, the electrical power consumption in the voltage application step increases when the voltage application time is excessively long (Comparative Example 3), and the amount of power generated by the system decreased as a result. When the voltage application time is excessively short (Comparative Example 4), the electrical power consumption in the voltage application step can be decreased, but a sufficient recovery effect cannot be obtained. Thus, the amount of power generated by the system was not high.

Thus, it was confirmed that the recovery current is desirably set within the range of 1 $\mu$A/cm$^2$ or more and 100 $\mu$A/cm$^2$ or less. In particular, in the range of 1 $\mu$A/cm$^2$ or more and 5 $\mu$A/cm$^2$ or less, the electrical power consumption in the voltage application step can be decreased while obtaining a high recovery effect.

The voltage application time is appropriately selected within the range of 0.1 to less than 10 times the length of the time for the light irradiation step, for example, according to the magnitude of the recovery current. The voltage application time and the magnitude of the recovery current may be, for example, selected so that the ratio of the electrical power consumption in the voltage application step (that is, the amount electrical power supplied to the solar cell from the power supply in the voltage application step) in the voltage application step with respect to the amount of power generated by the solar cell in the immediately previous light irradiation step is 0.001% or more and 1% or less.

The solar cell system according to an embodiment of the present disclosure finds wide usages as the power generation system that converts light, such as sunlight, artificial light, etc., into electricity. Moreover, due to its photovoltaic function, the system can be applied to optical sensors, such as a photodetector and an image sensor.

What is claimed is:

1. A solar cell system, comprising:
    a solar cell that includes a first electrode, a second electrode that faces the first electrode, and a light absorbing layer that is located between the first electrode and the second electrode, and converts light into charges;
    a power supply that applies voltage between the first electrode and the second electrode; and
    a voltage controller, wherein the light absorbing layer contains a compound having a perovskite crystal structure represented by AMX$_3$ where A represents a monovalent cation, M represents a divalent cation, and X represents a halogen anion, and
    the voltage controller controls the voltage of the power supply so that during a first period of non-power generation, an electric current of 1 $\mu$A/cm$^2$ or more and 100 $\mu$A/cm$^2$ or less flows in the light absorbing layer in a direction opposite to a direction in which an electric current flows during power generation.

2. The solar cell system according to claim 1, wherein the electric current that flows in the first period of the non-power generation is 1 $\mu$A/cm$^2$ or more and 5 $\mu$A/cm$^2$ or less.

3. The solar cell system according to claim 1, wherein the voltage controller controls the power supply so that a length of the first period is 0.1 to less than 10 times an accumulated value of a time during which the solar cell is irradiated with light from a time at which last application of the voltage is ended.

4. The solar cell system according to claim 1, wherein the voltage controller controls a magnitude of the voltage of the power supply and a length of the first period so that an amount of electrical power consumed by application of the voltage by the power supply is 0.001% or more and less than 1% with respect to an amount of electrical power generated by the solar cell from a time at which last application of the voltage is ended.

5. The solar cell system according to claim 1, wherein the solar cell further includes an electron transporting layer that transports electrons from the light absorbing layer to the first electrode, the electron transporting layer being located between the first electrode and the light absorbing layer.

6. The solar cell system according to claim 1, wherein the solar cell further includes a hole transporting layer that transports holes from the light absorbing layer to the second electrode, the hole transporting layer being located between the second electrode and the light absorbing layer.

7. A method for operating a solar cell system that includes a solar cell,
    the solar cell including a first electrode, a second electrode that faces the first electrode, and a light absorbing layer that is located between the first electrode and the second electrode, converts light into charges, and contains a compound having a perovskite crystal structure represented by AMX₃ where A represents a monovalent cation, M represents a divalent cation, and X represents a halogen anion, the method comprising:

during power generation, extracting, through the first electrode and the second electrode, electrical power generated by conversion of light into charges by the light absorbing layer, and during a first period of non-power generation, applying a voltage between the first electrode and the second electrode so that an electric current of 1 $\mu$A/cm² or more and 100 $\mu$A/cm² or less flows in the light absorbing layer in a direction opposite to a direction in which an electric current flows during the power generation.

8. The method according to claim 7, wherein the extracting the electrical power during the power generation and the applying the voltage during the non-power generation are alternately repeated.

9. The method according to claim 7, wherein the voltage is applied when an accumulated value of a time during which the solar cell is irradiated with light from a time at which last application of the voltage is ended reaches a particular time.

10. The method according to claim 7, wherein a magnitude of the voltage and a length of the first period are set according to an accumulated value of a time during which the solar cell is irradiated with light from a time at which last application of the voltage is ended.

11. The method according to claim 7, wherein a magnitude of the voltage and a length of the first period are set so that an amount of electrical power consumed by application of the voltage is 0.001% or more and less than 1% with respect to an amount of electrical power generated by the solar cell from a time at which last application of the voltage is ended.

* * * * *